United States Patent [19]

Ganssloser et al.

[11] Patent Number: 4,992,981

[45] Date of Patent: Feb. 12, 1991

[54] DOUBLE-ENDED MEMORY CELL ARRAY USING INTERLEAVED BIT LINES AND METHOD OF FABRICATION THEREFORE

[75] Inventors: Kurt Ganssloser, Böblingen; Dieter F. Wendel, Sindelfingen; Siegfried K. Wiedmann, Stuttgart, all of Fed. Rep. of Germany

[73] Assignee: International Business Machines Corporation, Armonk, N.Y.

[21] Appl. No.: 399,359

[22] Filed: Aug. 24, 1989

Related U.S. Application Data

[63] Continuation of Ser. No. 58,459, Jun. 5, 1987, abandoned.

[51] Int. Cl.$^5$ .............................................. G11C 11/40
[52] U.S. Cl. .................................. 365/154; 365/205; 365/63
[58] Field of Search .................... 365/190, 51, 70, 63, 365/205, 154, 206, 174

[56] References Cited

U.S. PATENT DOCUMENTS

| | | | |
|---|---|---|---|
| 4,158,237 | 6/1979 | Wiedmann | 365/154 |
| 4,425,574 | 1/1984 | Silvestri et al. | 357/50 |
| 4,445,201 | 4/1984 | Pricer | 365/154 X |
| 4,476,547 | 10/1984 | Miyasaka | 365/205 X |
| 4,586,171 | 4/1986 | Fujishima | 365/63 |
| 4,709,351 | 11/1987 | Kajigaya | 365/51 |
| 4,916,661 | 4/1990 | Nawaki et al. | 365/63 |
| 4,922,459 | 5/1990 | Hidaka | 365/206 |

OTHER PUBLICATIONS

IEEE Journal of Solid-State Circuits vol. SC-16 No. 5, Oct. 1981, p. 429, "High Speed Split-Emitter I$^2$L/MTL Memory Cell", by S. K. Wiedmann et al.

Primary Examiner—Stuart N. Hecker
Assistant Examiner—Alfonso Garcia
Attorney, Agent, or Firm—Thomas J. Kilgannon, Jr.

[57] ABSTRACT

The memory cell array is one in which the bit lines associated with each column of double-ended memory cells are interleaved with the bit lines of adjacent columns of memory cells. Because the spacing of metallic bit lines is governed by certain ground rules, cell length in the x-dimension could be reduced no further as long as metallic interconnections were used. To overcome the spacing limitation of metallic interconnections, polycrystalline fingers or extensions are substituted for metal cross-coupling interconnections. The latter in conjunction with metallic straps which are shorter than the widths and spacing of two metallic interconnection lines provides a significant reduction in the x-dimension and hence in cell area. The method and structure taught may be utilized with both bipolar and unipolar devices.

19 Claims, 7 Drawing Sheets

DOUBLE-ENDED MEMORY CELL ARRAY USING INTERLEAVED BIT LINES AND METHOD OF FABRICATION THEREFORE

This application is a continuation of application Ser. No. 07/058,459, filed June 5, 1987, now abandoned.

BACKGROUND OF THE INVENTION

Technical Field

This invention relates to the layout of memory cells and their associated pair of bit lines in such a way that very high density arrays are obtainable. The layout is accomplished without changing the process steps by which less dense arrays were obtained. The resulting memory cell array is one in which the bit lines associated with each column of memory cells are interleaved with the bit lines of adjacent columns of memory cells. By this means, regions of the semiconductor chip in which the cells are formed, which were formerly unusable, now become usable and cell area is significantly reduced. Because the spacing of metallic bit lines is governed by certain ground rules, cell length in the x-dimension could be reduced no further as long as metallic interconnections were used. To overcome this limitation without changing the process involved, polycrystalline fingers or extensions are substituted for metal cross-coupling interconnections. Because polycrystalline interconnections have less stringent requirements relative to their spacing, using such interconnections in conjunction with metallic straps which are shorter than the widths and spacing of two metallic interconnection lines again provides a significant reduction in the x-dimension and hence in cell area. When interleaved bit lines, polycrystalline fingers and straps are used at the same time instead of metal interconnections, both approaches provide a memory cell area which is significantly improved over cell areas when neither or only one of the approaches taught are used. The resulting cell is the densest cell obtainable using the same process steps. The method and structure taught may be utilized with both bipolar and unipolar devices.

BACKGROUND ART

Because high density in the integrated circuit environment contributes to speed of operation and reduces costs, efforts are being made continuously to obtain more speed by packing individual switchable devices more closely together. One way to achieve this is to reduce or limit interconnections between different portions of devices so that such devices can be laid out with smaller areal dimensions. As will be seen from a consideration of the prior art discussed hereinbelow, little or no attention has been paid to the manipulation of interconnections themselves so that the associated related devices can be transposed and positioned into chip areas which were once unusable.

An article entitled "High-Speed Split Emitter I²L/MTL Memory Cell" by S. K. Wiedmann et al, IEEE Journal of Solid State Circuits, Vol. SC-16, No. 5, October 1981, pp.429–434, shows the layout of a typical I²L/MTL memory cell wherein the bit lines of a cell and the cross-coupling interconnections of the cell are metallic and are disposed perpendicularly relative to the cell device isolation. This is the usual approach to bit line and interconnection positioning and as used provides a relatively fast and dense memory array.

U.S. Pat. No. 4,158,237 filed July 13, 1978 and assigned to the present assignee shows the basic I²L circuit and in layout diagram, shows the vertical arrangement of word lines and cross-coupling interconnections. Bit lines in this reference are arranged horizontally. The teachings of this patent with respect to positioning and orientation of bit and word lines, do not depart significantly from known practices.

U.S. Pat. No. 4,425,574 filed June 12, 1981 and assigned to the present assignee relates to a buried injector MTL (Merged Transistor Logic) memory cell. The reference shows a pair of cross-coupling metallic interconnections which are parallel to a pair of isolation regions and perpendicular to a pair of buried bit lines. It is relevant only to the extent that the metal interconnections are parallel to the isolation regions and do not extend across that region.

It is, therefore, a principal object of this invention to provide a memory cell layout arrangement in which the bit lines of a cell have been interleaved with the bit lines of adjacent cells.

Another object of the present invention is to provide a memory cell layout arrangement in which semiconductor regions associated with the cell bit lines are transposed into previously unused areas of a semiconductor chip.

Still another object is to provide a memory cell layout arrangement in which polycrystalline fingers or extensions are coupled with metal straps to provide cross-coupling interconnections.

Yet another object is to provide a memory cell layout arrangement which provides a higher density than prior art approaches without changing the basic fabrication method.

SUMMARY OF THE INVENTION

The present invention relates to a memory array and to a layout arrangement for the semiconductor memory cells of that array. It also relates to the method for laying out such memory cells to provide a high speed, high density memory array.

The memory array broadly includes a plurality of memory cells which are arranged in rows and columns. It includes a word line connected to each row. Each column of bit lines has an associated pair of bit lines and at least one of the pair of bit lines is interleaved with the bit line of an adjacent column of memory cells. In most instances, however, both of the pair of bit lines are interleaved with the bit lines of adjacent columns of memory cells.

The memory array further includes first npn and pnp transistors spaced from second npn and pnp transistors by an isolation region and means for cross-coupling a pair of n and p regions of said first and second npn transistors.

The latter means includes a first polycrystalline element connected to a p-region of the first npn transistor which has a finger-like extension extending across the isolation region. A second similar element connected to a p-region of the second npn transistor also extends across the isolation region. Both of these extensions terminate in the vicinity of the n-regions of the second and first npn transistors and are connected to these n-regions by means of a metallic strap. The bit lines of each memory cell are connected to associated input devices. While the semiconductor devices involved have been characterized as bipolar, there is no reason why the teaching of the present invention cannot be applied to memory cells which incorporate unipolar devices such as FET's.

The method of the present invention broadly includes the step of arranging a plurality of memory cells in rows and columns in a semiconductor chip. Each row of cells has an associated word line and each column has an associated pair of bit lines. The method further includes the step of interleaving one or both of the pair of bit lines with the bit line or bit lines of an adjacent column or columns of memory cells.

The memory array resulting from the layout method takes advantage of previously unused regions of a semiconductor chip and provides an extremely dense high speed memory array.

These and other objects, features and advantages of the present invention will become more apparent from the following more particular description of a preferred embodiment.

BRIEF DESCRIPTION OF THE DRAWINGS

FIG. 4 is a partially schematic, partially block diagram representation of the circuit of FIG. 1 as it would appear in an array configuration and wherein a bit line of a first column has been interchanged or interleaved with a bit line of an adjacent column, and so on.

DESCRIPTION OF A PREFERRED EMBODIMENT

Figure 1:
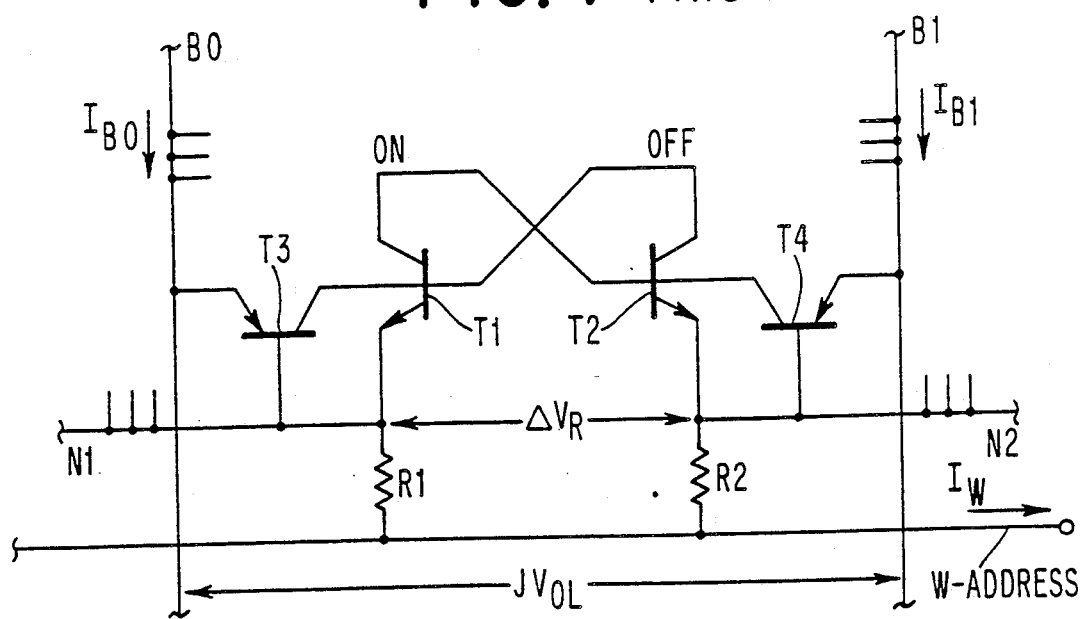
FIG. 1 is a schematic diagram of a prior art split emitter memory cell which utilizes cross-coupling of the bases and collectors of the bipolar devices of the memory cell.

FIG. 1 is schematic diagram of a split-emitter memory cell which utilizes cross-coupling of the bases and collectors of the bipolar devices of the memory cell. The memory cell of FIG. 1 is described and discussed in detail in the IEEE Journal of Solid-State Circuits, Vol. SC-16, pp. 429–434, October 1981 by S. K. Wiedmann et al; the contents of which are hereby incorporated by reference. To the extent there is interest in the operation and fabrication of the circuit of FIG. 1, this information can be readily gleaned from the above mentioned article. In addition, the article shows the fundamental layout of a split-emitter cell showing a pair of bit lines connected to injectors. The bit lines are usually made of metal and, under the usual ground rules must be spaced a certain minimum distance from other metal interconnections. In the circuit of FIG. 1, the other metal interconnections would be the cross-coupling interconnections between the bases and collectors of the devices whose emitters are connected to booster resistors. From this, it can be seen that cell area is greatly controlled by the minimum distance required between adjacent metal lines or interconnections.

Figure 2:
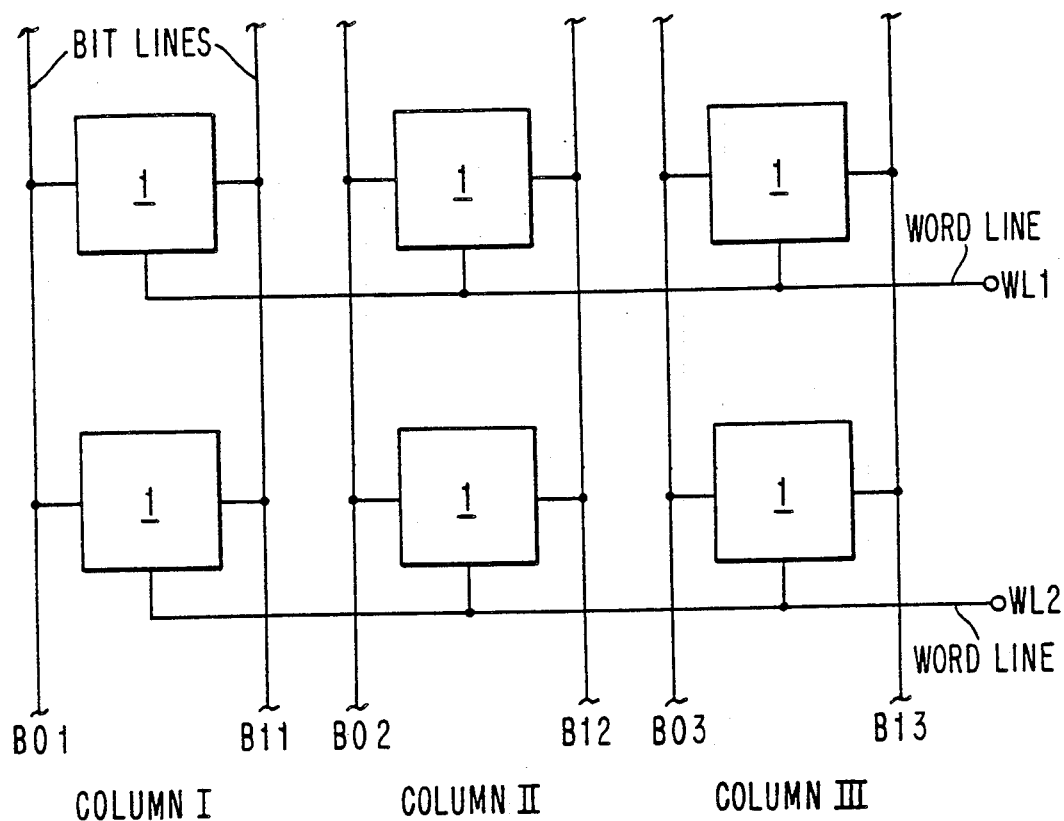
FIG. 2 is a partially schematic, partially block diagram representation of the circuit of FIG. 1 as it would appear in an array configuration. Note that the bit lines for a column of cells are disposed immediately adjacent the cells of a given column.

FIG. 2 is a partially schematic, partially block diagramatic representation of the circuit of FIG. 1 as it would appear in an array configuration. In FIG. 2, blocks 1 each represent the split-emitter memory cell of FIG. 1. Bit lines B01 and B11 are connected to a pair of blocks or cells 1 and are otherwise identified in FIG. 2 as being in Column I. Similarly, bit lines B02, B12 and B03, B13 are identified as being associated with Column II and Column III, respectively. Word lines WL1 and WL2 are shown connected to rows of split-emitter cells 1 in FIG. 2. The word line and bit line arrangements are standard and are generally arranged in the manner shown for most prior art memory arrays. Note that the bit lines for a column of cells are positioned immediately adjacent the cells of that column. The reason for noting this will become clear in connection with the discussion of FIG. 4 hereinbelow.

Figure 3:
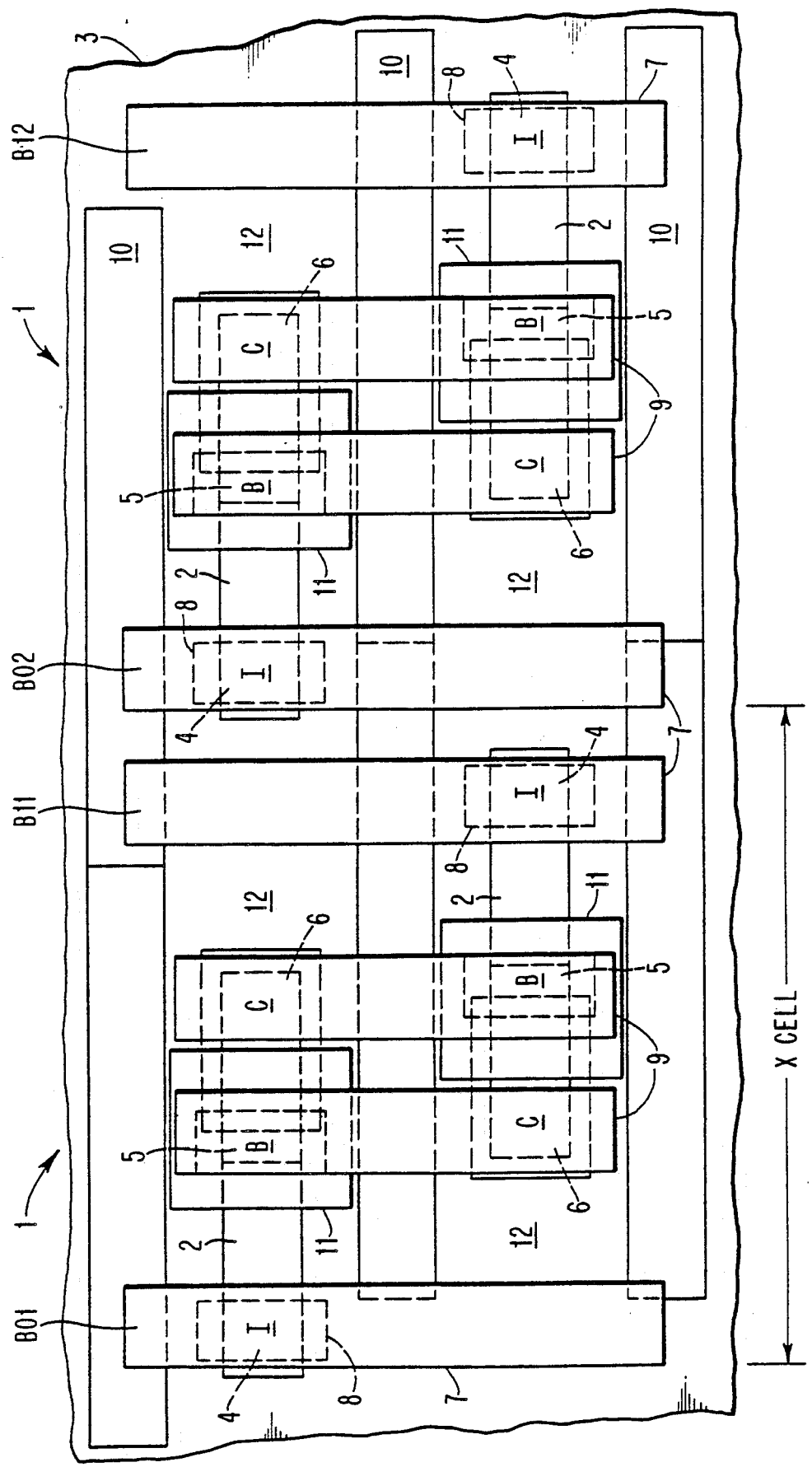
FIG. 3 is a layout diagram of the prior art circuit of FIG. 1 showing a pair of cells as they would appear in an array configuration. The diagram clearly shows metal interconnections cross-coupling the bases and collectors of the bipolar devices of the cell and areas of unused "real estate" resulting from the application of layout rules required when metallization is used for interconnections.

FIG. 3 is a layout diagram of the prior art circuit of FIG. 1 showing a pair of cells 1 as they would appear in an array configuration. The diagram clearly shows metal interconnections cross-coupling the bases and collectors of the bipolar devices of a cell and also shows areas of unused "real estate" resulting from the application of layout rules required when metallization is used for interconnections.

Referring now to FIG. 3 in more detail, only certain major features of the semiconductor devices involved are shown so that the inventive concepts to be taught are not obscured by too much detail.

In FIG. 3, semiconductor regions 2 are surrounded by recessed oxide regions 3. Semiconductor regions 2 are regions of n-type conductivity into which regions of p-type conductivity have been diffused or implanted. In FIG. 3, regions 4 otherwise identified in FIG. 3 by the designation I are such regions. The designation I indicates that regions 4 are injectors of memory cells 1. Other such regions in FIG. 3 are regions 5 otherwise identified in FIG. 3 by the designation B which indicates that these regions are the bases of NPN semiconductor devices which make up memory cells 1. In FIG. 3, n-type regions 6 are formed in p-type regions 5 by diffusion or ion implantation and are otherwise identified in FIG. 3 by the designation C which indicates that they are the collectors of the NPN semiconductor devices which make up memory cells 1.

Considering now the regions designated I, they are engaged by bit lines 7 otherwise designated in FIG. 3, from left to right by the designations B01, B11, B02, B12 via oxide holes 8 which have been formed in an oxide layer which overlies region 4.

The layout of memory cells 1 is completed in FIG. 3 by interconnections 9 which are designed to interconnect regions B and C of memory cells 1. Thus, uppermost region B connects with lowermost region C and another interconnection 9 connects lowermost region B with uppermost region C of the same memory cell 1. Interconnections 9 are similarly connected in every other cell 1 of the memory array a portion of which is shown in FIG. 3. In FIG. 3, semiconductor regions 2 are separated from each other by an isolation region 10 and from other regions 2 in other rows by similar isolation regions 10. In FIG. 3, leftmost interconnections 9 for each of the memory cells 1 extend between a collector region 6 and a base region 5. Where interconnections 9 contact regions C, they contact these regions directly. Where interconnections 9 contact regions 5, they contact these regions via polycrystalline regions 11, a portion of which is in direct contact with regions 5. Because of the rules applied to the layout of metallic bit lines 7 and metallic interconnections 9 and the spacing requirements of regions 4 and 5, a certain minimum spacing is required to minimize electrical interactions among these conductors. When this is accomplished, relatively large areas of real estate remain unutilized generally impacting the density of memory arrays which incorporate such metal lines and interconnections unfavorably. A consideration of FIG. 3 shows that "lost areas" 12 remain unutilized in each of memory cells 1 shown in FIG. 3 in that neither bit lines 7 nor interconnections 9 pass over these areas. In FIG. 3, the y-dimension is given by two minimum isolation regions 10 pitches while the x-dimension is, in general, determined by four minimum metal line pitches which, in FIG. 3 include two bit lines 7 and two interconnections 9. The x-dimension shown in FIG. 3 as $X_{cell}$ may, for example, be 12.8μm.

Figure 4:
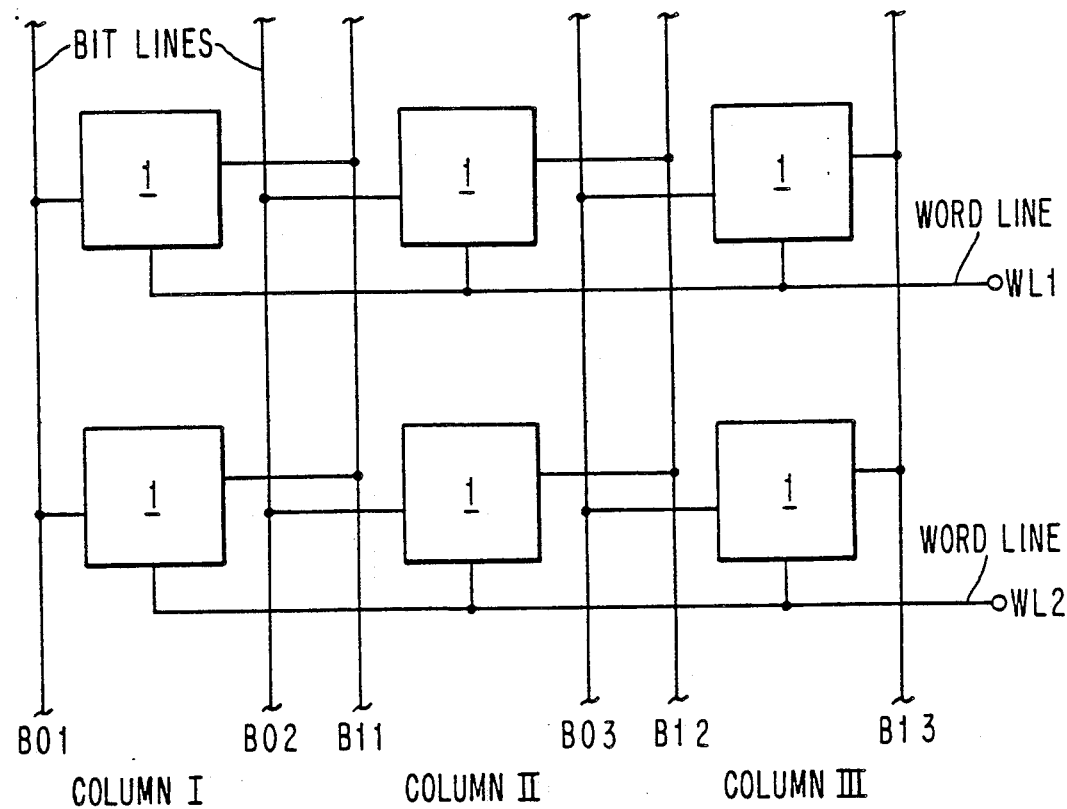

FIG. 4 is a partially schematic, partially block diagram representation of the circuit of FIG. 1 as it would appear in an array configuration and wherein a bit line of a first column has been interchanged or interleaved with a bit line of an adjacent column, and so on.

FIG. 4 is identical with FIG. 2 except that bit line B02 has been interchanged or interleaved with bit line B11 and bit line B03 has been interchanged or interleaved with bit line B12 so that a bit line from one column is positioned adjacent the memory cells of the next succeeding column and a bit line of that column is disposed adjacent the memory cells of the next column and so on. Interchanging or interleaving the bit lines of an array as shown in FIG. 4 results in significant savings in real estate as can be seen by considering a layout diagram of FIG. 4 as shown in FIG. 5.

Figure 5:
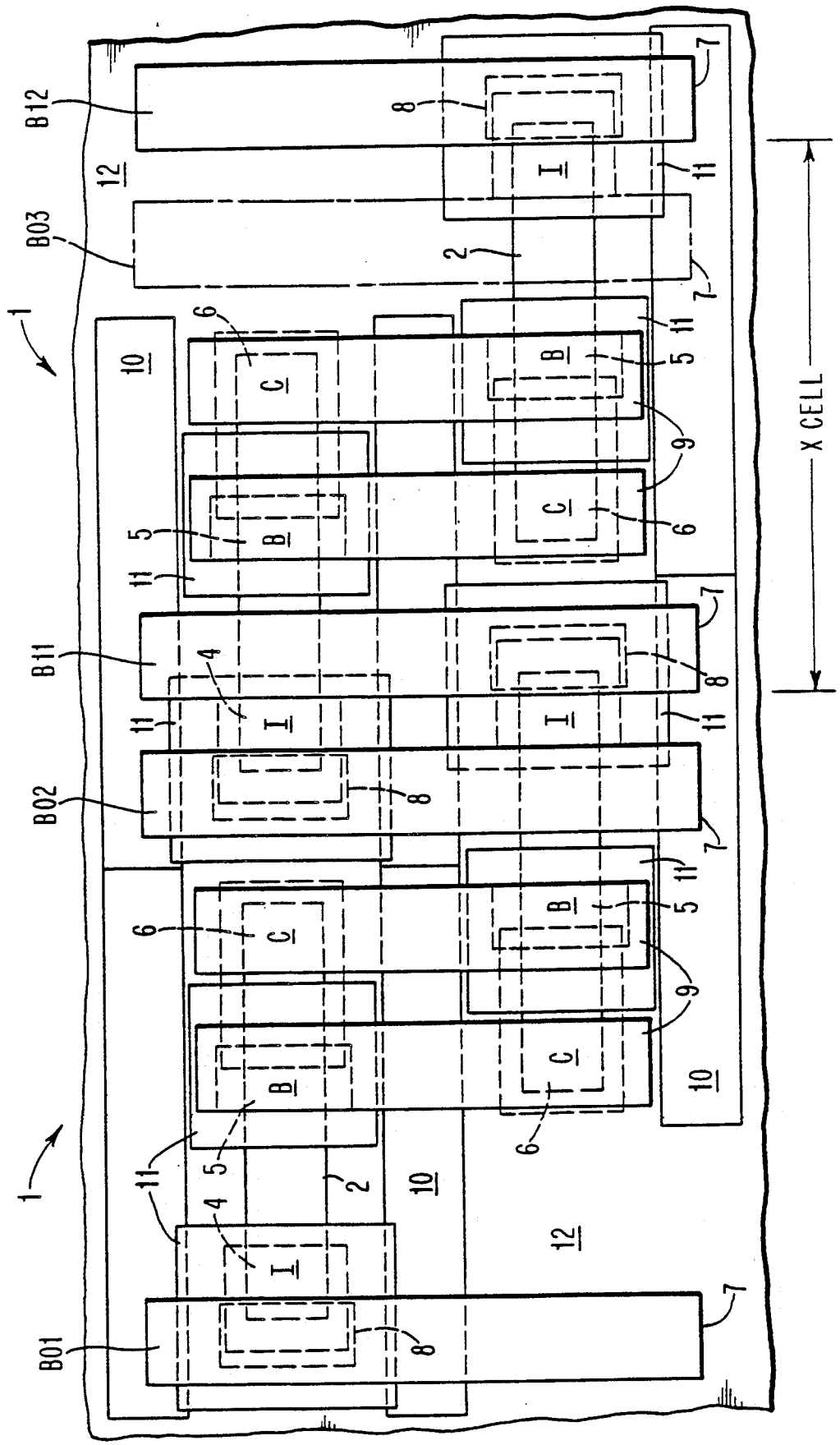
FIG. 5 is a layout diagram similar to that shown in FIG. 3 except that portions of the bipolar devices have been moved into unused portions of the "real estate" and a metal bit line of one cell has been interchanged or interleaved with the bit line of the adjacent cell so that it is disposed inside the bit line rather than outside the bit line of the adjacent cell. This pattern is repeated for every cell in an array. Thus, while the width of devices involved becomes larger, the overall cell width becomes smaller relative to the cell width of the array of FIG. 3. The interleaving of the bit lines permits the unused "real estate" to be used resulting in an overall reduction in cell area.

FIG. 5 is a layout diagram similar to that shown in FIG. 3 except that portions of the bipolar devices of the memory cells have been moved into unused portions of the "real estate" and a metal bit line of one cell has been interchanged or interleaved with a bit line of an adjacent memory cell so that it is disposed inside rather than outside the bit line of the adjacent memory cell and passes in insulated spaced relationship over a portion of a memory cell 1 in an adjacent column. This pattern is repeated for every cell in an array. Thus, while the width of the devices involved becomes larger, the overall memory cell width becomes smaller relative to the cell width of the array of FIG. 3. The interchanging or the interleaving of the bit lines permits the unused "real estate" to be used resulting in an overall reduction in cell area.

Elements in FIG. 5 which are similar to those shown in FIG. 3 have been labeled with the same reference characters.

At this point, it should be recalled that "lost areas" 12 shown in FIG. 3 are regions over which neither interconnections 9 nor bit lines 7 pass. To the extent that areas 12 are unutilized, the overall array density is affected negatively which, in turn, affects speed and performance negatively. Density enhancement can always be carried out by making design changes or by changing the process used to fabricate an array. However, in this instance, improvements in density were sought without changing the basic process involved. This was accomplished as shown in FIG. 5 by moving portions of semiconductor regions 2 into "lost areas" 12 and by moving bit lines 7 in such a way that the bit lines of adjacent cells are interchanged positionally but not functionally. Thus, region I in FIG. 3 under bit line B02 is moved leftwardly so that it now occupies "lost area" 12 which, in FIG. 3, is generally disposed between the upper portion of bit line B11 and the upper portion of adjacent interconnection 9. Note in FIG. 5 that the same region I which was under bit line B02 in FIG. 3 now occupies what was a "lost area" 12 and that it is still connected to bit line B02 by moving bit line B02 so that it is now disposed to the left of bit line B11 rather than to the right of it as in FIG. 3. In a similar way, region C of bottom rightmost region 2 is positioned so that it now occupies "lost area" 12 which is generally positioned between the bottom of bit line B02 and the bottom of adjacent interconnection 9 to the right of bit line B02 in FIG. 3. Note in FIG. 5, that the last mentioned "lost area" 12 has disappeared and the last mentioned region C remains connected to its original interconnection 9. The disappearance of a "lost area" 12 can be seen more clearly in FIG. 5 by considering bit line B03 (shown in phantom) in the absence of its associated region I which would be under the upper portion of B03 and normally connected to it. The reference character 12 for a "lost area" is shown under bit line B03 to indicate that areas previously unutilized like that under bit line B03 are now utilized. The result of interchanging the position of a bit line of one cell with the bit line of an adjacent memory cell is that portions of semiconductor regions 2 are moved into "lost areas" 12 along with their associated bit lines increasing the density of the memory array without changing the basic process.

From what has just been discussed, it should be clear that as bit lines are interchanged or interleaved, associated portions of semiconductor regions 2 are also moved. Thus, regions I and C are moved into "lost areas" 12 along with associated bit lines 7 and interconnections 9. It should be noted that if the pitch ($X_{cell}$) of the first and last memory cells 1 of a row of cells were measured, little or no improvement in the pitch would be apparent because a "lost area" 12 associated with these cells remains unused.

Note in FIG. 5, that bottom leftmost "lost area" 12 is still present and that another "lost area" 12 would also remain between the upper portion of last bit line B1N and the adjacent interconnection line to the left of B1N. In FIG. 5, the horizontal pitch ($X_{cell}$) of memory cells 1 except the first and last cells 1 of a row of cells, is measured between the left side of B11 and the left side of B12 for a distance of four metal pitches. In FIG. 5, the pitch, $X_{cell}$, is considerably smaller than the pitch in FIG. 3 for the same layout rules. The pitch in FIG. 3 was given as 12.8μm, for example. On the same scale, the pitch ($X_{cell}$) in FIG. 5 is, for example, 10.4μm. Since the vertical pitch is roughly the same, the areal improvement is proportional to the difference in the pitches and represents roughly a 20 percent reduction in area.

Figure 6:
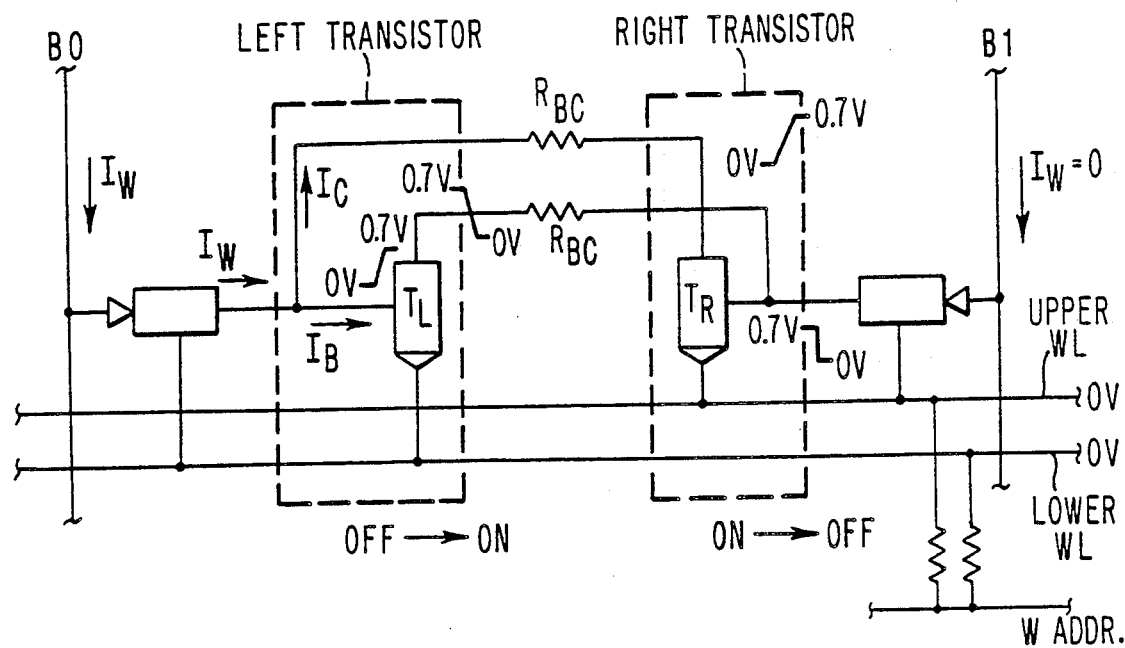
FIG. 6 is a schematic diagram of a polysilicon-coupled split emitter memory cell that carries out the functions of the circuit of FIG. 1 in a smaller area.

Referring now to FIG. 6, there is shown a schematic diagram of a cross-coupled split emitter memory cell that carries out the functions of the circuit of FIG. 1 in a smaller area. This is accomplished by cross-coupling the bases and collectors of each memory cell with extensions or fingers from the polycrystalline elements which are normally used to form the extrinsic bases of each of the transistors. As will be seen from a consideration of FIGS. 7, 8 hereinbelow, the extensions or fingers eliminate the requirement for metal interconnections which normally run parallel to the memory cell bit lines. In this regime, the ground rules for the spacing of metal lines are invoked and the minimum spacing which is obtained does little to enhance array density. At this point, it was recognized that if metal interconnections were to be used, one could expect no improvement in density using the metal line spacing ground rules. It was also recognized that if other ground rules could be substituted by using other materials such as polysilicon, density improvements could be obtained. This, however, had to be accomplished without changing the basic process. Because polysilicon is used to out-diffuse the extrinsic bases of the transistors of the memory cell, it was recognized that extensions or fingers of polysilicon could be extended across the horizontally disposed isolation regions 10 bringing them into the vicinity of the collectors to which they were to be ultimately connected. Then, only short pieces of metal disposed parallel to the horizontal isolation regions 10 would be required to connect the base of one device to the collector of the other and vice versa.

Figure 7:
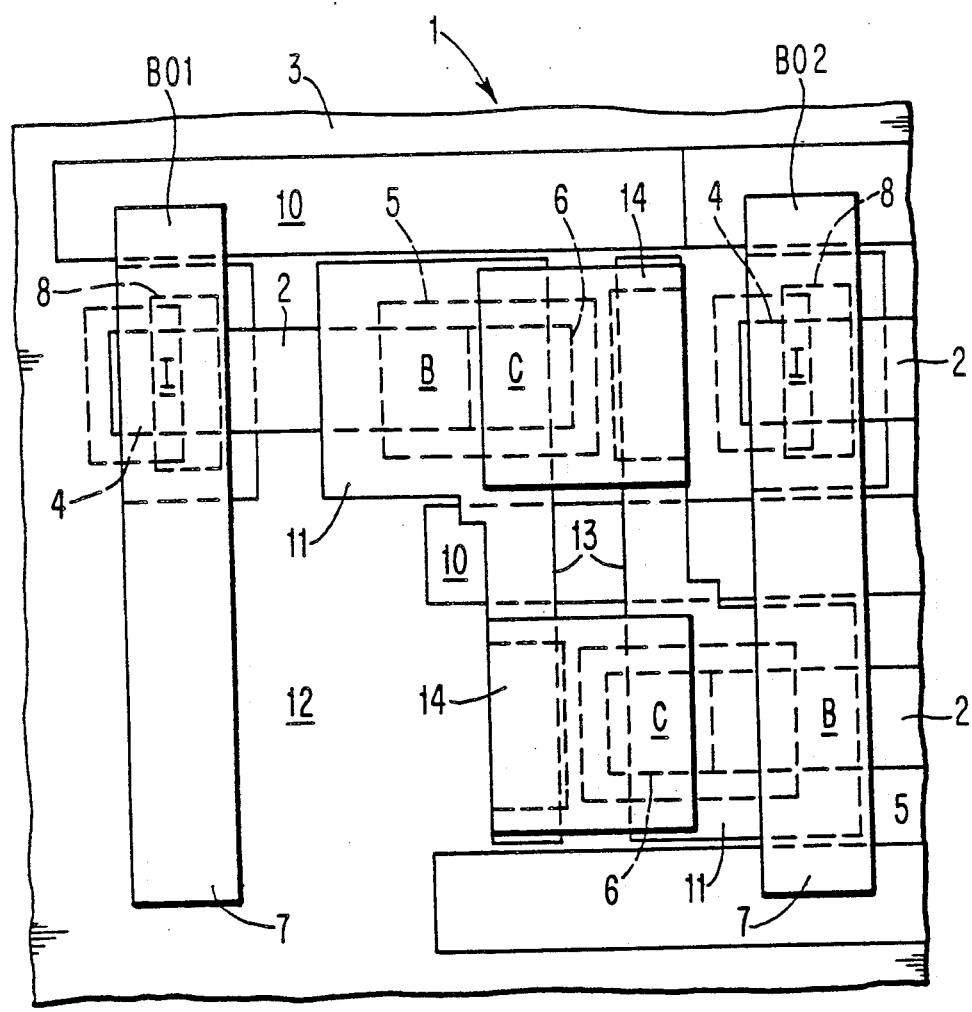
FIG. 7 is a layout diagram of the circuit of FIG. 6 which shows the use of polysilicon fingers to cross-couple the bases and collectors of the bipolar devices of the memory cell.

FIG. 6 shows a pair of resistors, $R_{BC}$, in the cross-coupling interconnections which are used to limit the dynamic collector current, $I_C$, during write operations such as when a write current, $I_W$, is supplied to transistor $T_L$ during a write zero, "0", operation. This, in turn, provides a large dynamic base current, $I_B$, causing a fast turn-on of transistor $T_L$. The polysilicon areas and fingers or extensions may, of course, be doped appropriately to provide the desired values of resistance for $R_{BC}$. FIG. 7 shows a layout diagram of the circuit of FIG. 6 which eliminates those metal interconnections which cause interconnection spacing ground rules to be invoked which basically limit the minimum density which can be attained in an array of memory cells.

FIG. 7 is a layout diagram of the circuit of FIG. 6 which shows the use of polysilicon fingers or extensions to cross-couple the bases and collectors of the bipolar devices of a split emitter memory cell.

Elements in FIG. 7 which are the same as elements in the previous figures have been given the same reference characters Considering FIG. 7 in detail, a comparison of a memory cell 1 of this figure with a memory cell 1 of FIG. 5 shows that they are very similar except for the fact that metal interconnections 9 are missing. In their stead, finger-like extensions 13 which extend from polycrystalline regions 11 across isolation region 10 have been substituted. Fingers 13 require only the use of a modified mask so that fingers 13 along with regions 11 remain when the unmasked portions of the polycrystalline layer from which they are formed are removed. No change in the basic process beyond this is required to accomplish this modification. The resulting fingers 13 terminate near collector regions 6 to which they are connected by means of metal interconnections or straps 14. In this way, base region 5 of upper semiconductor region 2 is cross-coupled to collector region 6 of lower semiconductor region 2 and base region 5 of lower semiconductor region 2 is cross-coupled to collector region 6 of upper semiconductor region 2. The use of fingers 13 and interconnections 14 eliminates vertical metallic interconnections 9 and permits new ground rules to be invoked which permits closer spacing of bit lines 7 to fingers 13. The latter elements were, of course, the substitutes for metallic interconnections 9 which caused a wider spacing to be used in the first place. FIG. 7 shows the first memory cell 1 in a row of cells and, as such, it contains a lost area 12 which is present at the beginning and end of each row. It should, however, be noted that the next p-type region 4 or region designated I in FIG. 7 is connected to a bit line 7 designated B02 indicating that it is a bit line for the second memory cell 1 in the row and is disposed in interleaved fashion with a bit line 7 of the first memory cell 1 in the row. The p-type region 4 connected to bit line 7 and designated B02 occupies what was previously a lost area 12 thereby obtaining the areal gain due to interleaving of the bit lines in addition to that obtained by the use of polycrystalline fingers 13 discussed hereinabove. This can be more clearly seen from a consideration of the layout diagram of FIG. 8 wherein a plurality of memory cells 1 is shown as they appear in an array configuration. Note that memory cells 1 have identical features and that polycrystalline fingers 13 and straps 14 are used instead of metallic interconnections 9. Also note that bit line B02 is interleaved with bit line B11 and that the former is connected to an associated injector I via hole 8 in an underlying oxide layer which maintains bit line B02 in insulated spaced relationship with devices of memory cell 1 to which it has no electrical connection. The second bit line B11 of the first memory cell 1 of the row is disposed outside of bit line B02 and is connected to its associated injector I which is disposed in the lower portion of the first row of cells 1.

Figure 8:
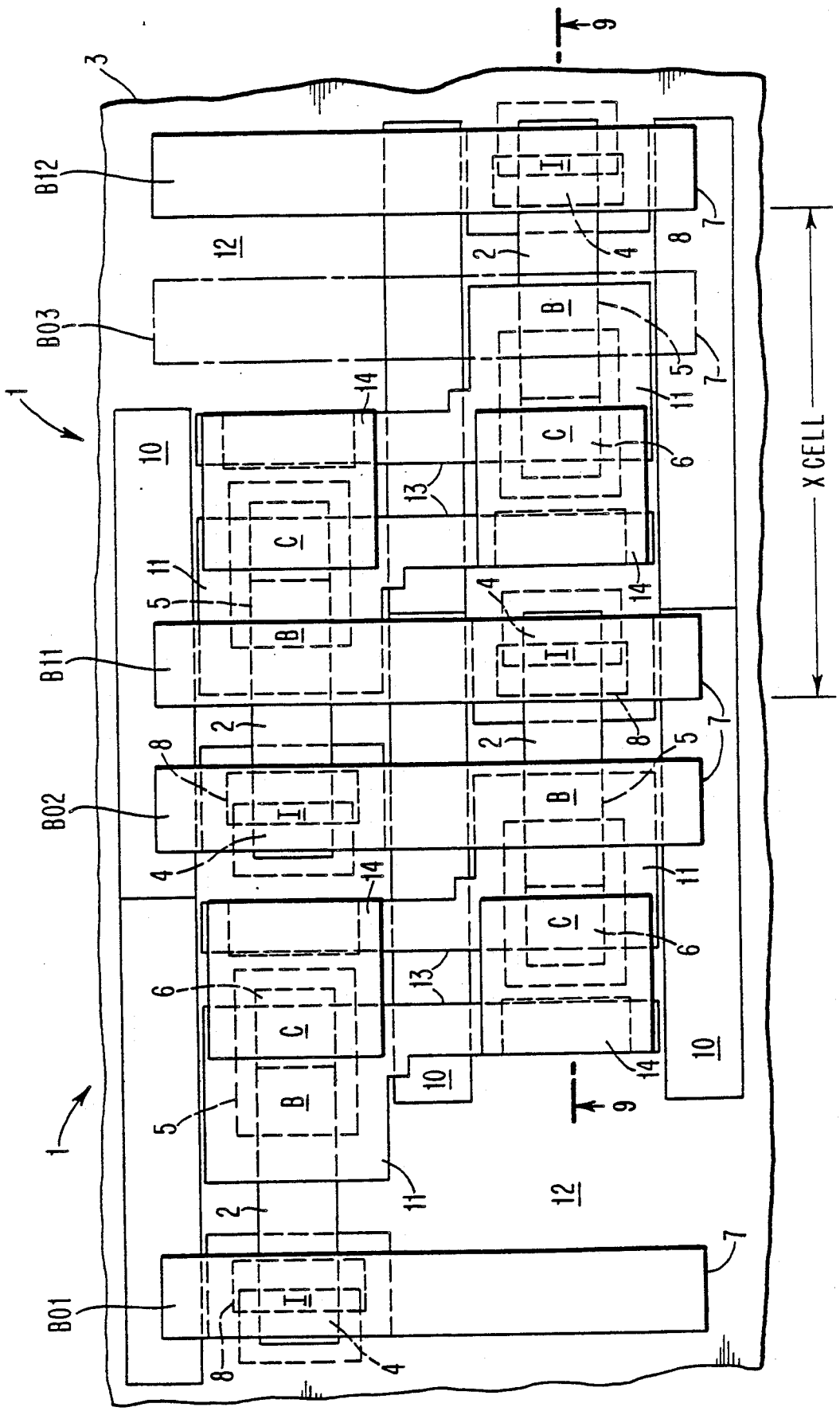
FIG. 8 is a layout diagram similar to that shown in FIG. 7 except that a plurality of memory cells is shown as they would appear in an array configuration. In addition to the elimination of vertical cross-coupling metallic interconnections due to the use of polysilicon fingers which provides an area gain, the interleaving of the bit lines as shown in FIG. 3 is also utilized providing a further reduction in cell width and cell area. The resulting array is tightly packed with a minimum of "real estate" unutilized.

In FIG. 8, bit line B03, which is shown in dashed line form, is interleaved with bit line B12 which is the second of the pair of bit lines associated with the second memory cell 1 of the row. It is shown in this manner to clearly indicate that it is disposed over a former lost area 12 into which the injector I of the third memory cell 1 of the row will be placed. It is interesting to note that the bit lines B02 and B03 are interleaved with bit lines B11 and B12, respectively, whereas only a single bit line of the end memory cells 1 of each row is interleaved with the bit line of an adjacent memory cell 1. In FIG. 8, the y-dimension of a cell is determined by the isolation pitch. This dimension has been fixed throughout the foregoing discussions whereas the x-dimension which was previously given as four metal pitches has been changed considerably by invoking the bit line interleaving technique and by eliminating the cross-coupling metallic interconnections and using polycrystalline fingers and metallic straps for cross-coupling. The latter approach also permits the fabrication of the resistance $R_{BC}$ (see FIG. 6) in these fingers by doping of the polycrystalline material. Metal strap 14 has a width which is smaller than the two metal pitches required when metal interconnections 9 were used. Since the minimum pitch of polysilicon lines is smaller than the minimum pitch of metal lines, a considerable savings in area can be achieved. When these savings are combined with the area saving obtained by interleaving the bit lines and positioning their associated injectors within now usable, lost areas, the resulting cell layout area appears to have been reduced to a minimum. Thus, in FIG. 8, the $X_{cell}$ of a memory cell 1 is measured from the leftmost portion of bit line B11 to the leftmost portion of bit line B12 in a manner which is consistent with the measurement of the x-dimension of the previous figures. In a representative example, $X_{cell}$ has a length of 9.4μm and the y-dimension is 18.6μm providing an area of 175.0μm². Recalling that the pitches shown in FIGS. 3,5 were 12.8μm and 10.4μm, respectively, and that the areal improvement is proportional to the $X_{cell}$, it is clear that a further reduction in area has been achieved by both interleaving bit lines and substituting polysilicon and metal straps for metallic cross-coupling interconnections.

Figure 9:
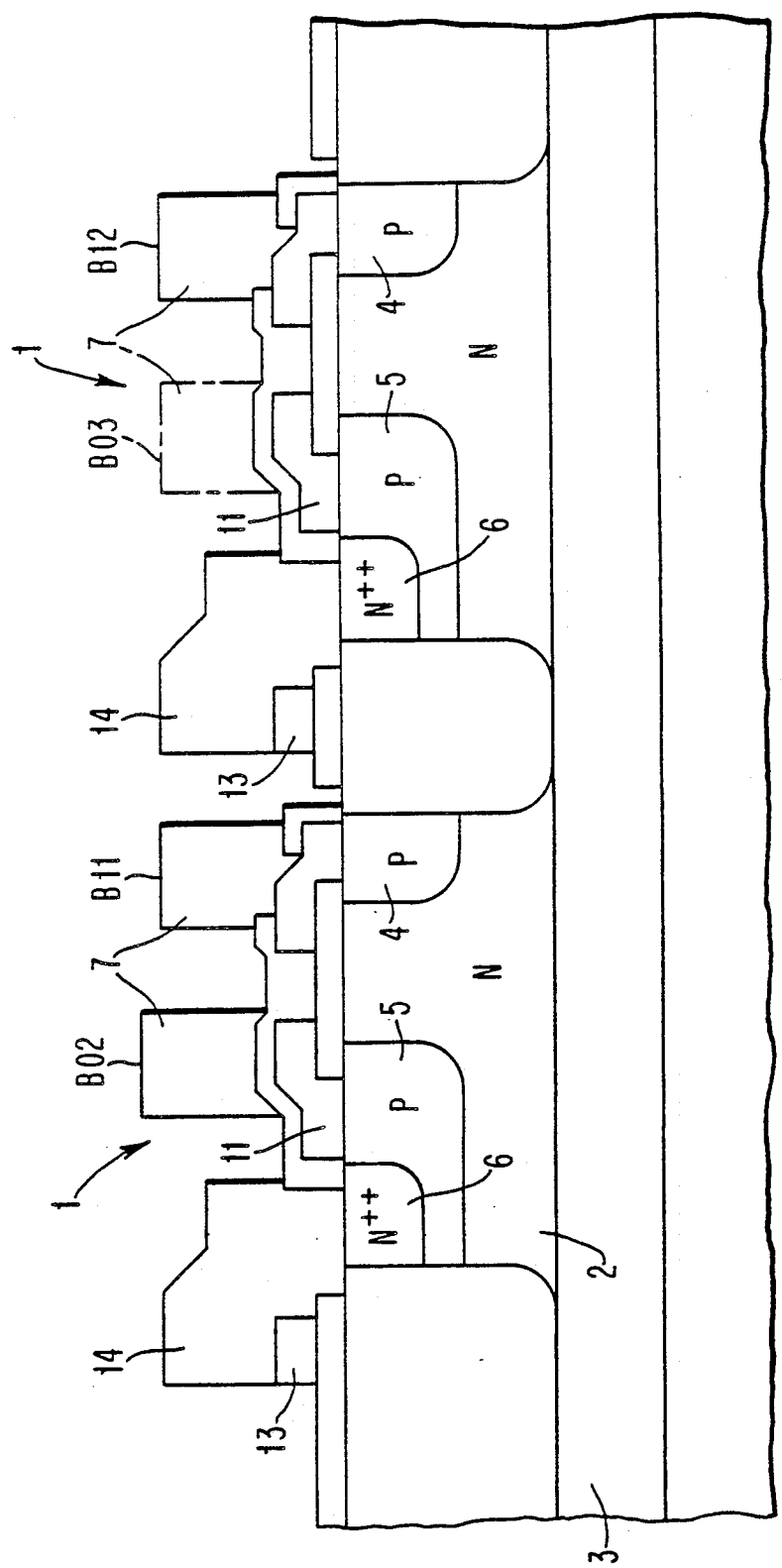
FIG. 9 is a cross-sectional view of a portion of the array shown in FIG. 8 taken along line 9—9 of FIG. 8.

FIG. 9 is a cross-sectional view of a portion of the array shown in FIG. 8 taken along line 9—9 of FIG. 8. FIG. 9 clearly shows how straps 14 interconnect fingers 13 and collector regions 6. Base regions 5 are also shown connected to polycrystalline regions 11 from which other fingers 13 extend across isolation 10 to ultimately connect to other collector regions 6. From this, it can be seen that the basic process steps remain unchanged except that fingers 13 are added when polycrystalline regions 11 are etched and metallizations 14 are included along with metallic bit lines 7 when they are formed by a metal etching step. It should be appreciated that the various n and p regions may be interchanged without departing from the spirit of the invention. Instead of P-fingers (bases), N-fingers (collectors) can be utilized in a similar fashion. In a similar vein, it should also be appreciated that devices other than bipolar transistors may be utilized in implementing the present invention. Thus, where memory cells incorporate a plurality of field effect transistors, pairs of bit lines to actuate them and cross-coupling of device gates, the present approach of interleaving bit lines can be utilized. Also, polysilicon interconnections can be extended across isolation to avoid metal spacing ground rules and can terminate in either a polysilicon or metal insulated gate.

Having thus described our invention, what we claim as new, and desire to secure by Letters Patent is:

1. A memory array comprising a plurality of bipolar memory cells arranged in rows and columns each said row of said memory cells having an associated word line, each of said memory cells including first and second pairs of complementary transistors spaced from each other by an isolation region, a plurality of pairs of bit lines, each pair of bit lines being connected to portions of memory cells in an associated column of memory cells, each of said pair of bit lines of each column being interleaved with the bit line of an adjacent column of memory cells and being disposed over a portion of each of said memory cells of an adjacent column of memory cells, a first polycrystalline element connected to a region of first conductivity type of one of said first pair of complementary transistors, said first element having a finger-like extension extending across said isolation region and terminating in the vicinity of a region of second conductivity type of one of said second pair of complementary transistors, and a second polycrystalline element connected to a region of fist conductivity type of said one of said second pair of complementary transistors, said second element having a finger-like extension extending across said isolation region and terminating in the vicinity of a region of second conductivity type of aid one of said first pair of complementary transistors, said extensions being connected to said regions of second conductivity type by metallic interconnections.

2. A memory array comprising a plurality of memory cells arranged in rows and columns, each said memory cell including a pair of cross-coupled transistor devices one terminal of each said pair of cross-coupled transistors being connected to a word line, a pair of input transistor devices connected to said pair of cross-coupled transistors one terminal of each of said pair of input transistors being connected to an associated one of a pair of bit lines, at least one of each of said pair of bit lines being interleaved with the bit line of an adjacent column of memory cells and extending in insulated spaced relationship with at least a transistor of each memory cell of said an adjacent column of memory cells.

3. A memory array according to claim 2 wherein each of said memory cells includes first npn and pnp transistors spaced from second npn and pnp transistors by an isolation region and further including means extending across said isolation region for cross-coupling a pair of n and p regions of said first and second npn transistors.

4. A memory array according to claim 2 wherein each of said memory cells includes first npn and pnp transistors spaced from second npn and pnp transistors by an isolation region and further including means extending across said isolation region for cross-coupling a pair of n and p regions of said first and second pnp transistors.

5. A memory array according to claim 3 wherein said means for cross-coupling a pair of n and p regions includes a first polycrystalline element connected to a p-region of said first npn transistor said first element having a finger-like extension extending across said isolation region and terminating in the vicinity of an n-region of said second npn transistor and a second polycrystalline element connected to a p-region of said second npn transistor said second element having a finger-like extension extending across said isolation region and terminating in the vicinity of an n-region of said first npn transistor, said extensions of said first and second polycrystalline elements being connected to said n-regions by metallic interconnections.

6. A memory array according to claim 4 wherein said means for cross-coupling a pair of n and p regions includes a first polycrystalline element connected to an n-region of said first pnp transistor said first element having a finger-like extension extending across said isolation region and terminating in the vicinity of a p-region of said second pnp transistor and a second polycrystalline element connected to an n-region of said second pnp transistor said second element having a finger-like extension extending across said isolation region and terminating in the vicinity of a p-region of said first pnp transistor, said extensions of said first and second polycrystalline elements being connected to said p-regions by metallic interconnections.

7. A memory array according to claim 5 wherein said npn and pnp transistors are bipolar transistors.

8. A memory array according to claim 6 wherein said npn and pnp transistors are bipolar transistors.

9. A memory array comprising a plurality of memory cells arranged in rows and columns, each said row of said memory cells having an associated word line connected to a pair of cross-coupled transistors of each of said memory cells, and
 a pair of bit lines connected to input transistors of said memory cells in each said column of memory cells said input transistors being connected to said pair of cross-coupled transistors, each of said pair of bit lines of each column being interleaved with the bit lines of adjacent columns of memory cells and extending in insulated spaced relationship with at least a transistor of each memory cell of said adjacent columns of memory cells.

10. A memory array according to claim 9 wherein each of said memory cells includes first npn and pnp transistors spaced from second npn and pnp transistors by an isolation region and further including means extending across said isolation region for cross-coupling a pair of n and p regions of said first and second npn transistors.

11. A memory array according to claim 9 wherein each of said memory cells includes first npn and pnp transistors spaced from second npn and pnp transistors by an isolation region and further including means extending across said isolation region for cross-coupling a pair of n and p regions of said first and second pnp transistors.

12. A memory array according to claim 10 wherein said means for cross-coupling a pair of n and p regions includes a first polycrystalline element connected to a p-region of said first npn transistor said first element having a finger-like extension extending across said isolation region and terminating in the vicinity of an n-region of said second npn transistor and a second polycrystalline element connected to a p-region of said second npn transistor said second element having a finger-like extension extending across said isolation region and terminating in the vicinity of an n-region of said first npn transistor, said extensions of said first and second polycrystalline elements being connected to said n-regions by metallic interconnections.

13. A memory array according to claim 11 wherein said means for cross-coupling a pair of n and p regions includes a first polycrystalline element connected to an n-region of said first pnp transistor said first element having a finger-like extension extending across said isolation region and terminating in the vicinity of a p-region of said second pnp transistor and a second polycrystalline element connected to an n-region of said second pnp transistor said second element having a finger-like extension extending across said isolation region and terminating in the vicinity of a p-region of said first pnp transistor, said extensions of said first and second polycrystalline elements being connected to said p-regions by metallic interconnections.

14. A memory array according to claim 12 wherein said npn and pnp transistors are bipolar transistors.

15. A memory array according to claim 13 wherein said npn and pnp transistors are bipolar transistors.

16. A memory array comprising a plurality of memory cells arranged in rows and columns each said row of said memory cells having an associated word line, each of said memory cells including first and second pairs of complementary transistors spaced from each other by an isolation region, a plurality of pairs of bit lines, each pair of bit lines being connected to a transistor of each of said first and second pairs of complementary transistors in an associated column of memory cells, each of said pair of bit lines of each column being interleaved with the bit line of an adjacent column of memory cells and extending in insulated spaced relationship with at least a transistor of each memory cell of adjacent column of an memory cells,
 a first polycrystalline element connected to a region of first conductivity type of one of said first pair of complementary transistors, said first element having a finger-like extension extending across said isolation region and terminating in the vicinity of a region of second conductivity type of one of said second pair of complementary transistors, and
 a second polycrystalline element connected to a region of first conductivity type of one of said second pair of complementary transistors, said second element having a finger-like extension extending across said isolation region and terminating in the vicinity of a region of second conductivity type of said one of said first pair of complementary transistors, said extensions being connected to said regions of second conductivity type by metallic interconnections.

17. A memory array according to claim 16 wherein said first and second pairs of complementary transistors are bipolar transistors.

18. A memory array according to claim 16 wherein each of said bit lines of a pair of bit lines is connected to the other of said first and second pairs of complementary transistors.

19. A memory array according to claim 16 wherein said word line is connected to said one of said first and second pair of complementary transistors.

* * * * *